United States Patent [19]

Sakamoto

[11] 4,004,233
[45] Jan. 18, 1977

[54] SEARCH TYPE TUNING DEVICE

[75] Inventor: Yoichi Sakamoto, Takatsuki, Japan

[73] Assignee: Matsushita Electric Industrial Co., Ltd., Japan

[22] Filed: Mar. 14, 1975

[21] Appl. No.: 558,550

[30] Foreign Application Priority Data

| Mar. 22, 1974 | Japan | 49-32858 |
|---|---|---|
| Mar. 22, 1974 | Japan | 49-32859 |
| July 9, 1974 | Japan | 49-79572 |
| July 9, 1974 | Japan | 49-79573 |
| July 9, 1974 | Japan | 49-79574 |
| July 9, 1974 | Japan | 49-79575 |
| July 9, 1974 | Japan | 49-79576 |
| July 9, 1974 | Japan | 49-79577 |
| July 9, 1974 | Japan | 49-79578 |

[52] U.S. Cl. .................. 325/470; 325/335; 325/423; 325/453; 331/49
[51] Int. Cl.$^2$ .................. H04B 1/32
[58] Field of Search .................. 325/418, 420–423, 325/334, 335, 453, 491, 468–470; 331/17, 48, 49

[56] References Cited

UNITED STATES PATENTS

| 2,852,669 | 9/1958 | Ashby | 325/423 |
|---|---|---|---|
| 2,933,598 | 4/1960 | Heller et al. | 325/423 |
| 3,221,266 | 11/1965 | Vitkovits, Jr. | 331/19 |
| 3,274,494 | 9/1966 | Stanley | 325/420 |
| 3,432,758 | 3/1969 | Robert et al. | 325/420 |
| 3,435,346 | 3/1969 | Allen et al. | 325/423 |
| 3,473,128 | 10/1969 | Kiser | 325/422 |
| 3,573,355 | 4/1971 | Cavelos | 178/5.8 |
| 3,611,152 | 10/1971 | Sakai et al. | 325/421 |
| 3,675,132 | 7/1972 | Hansen et al. | 325/423 |
| 3,846,707 | 11/1974 | Sakamoto et al. | 325/334 |
| 3,936,753 | 2/1976 | Clark | 325/470 |
| 3,943,449 | 3/1976 | Hendrickson et al. | 325/420 |
| 3,946,329 | 3/1976 | Caspari | 325/421 |
| 3,947,774 | 3/1976 | Glennon et al. | 325/470 |

Primary Examiner—Robert L. Richardson
Assistant Examiner—Marc E. Bookbinder
Attorney, Agent, or Firm—Burgess, Ryan and Wayne

[57] ABSTRACT

A search type tuning device wherein the output signal representing the difference frequency between the output frequency from a voltage-controlled frequency sweep oscillator and a reference frequency is filtered by a low-pass filter; the difference between the output voltage from the low-pass filter and a predetermined driving voltage for sweeping the oscillation frequency of the oscillator is derived from an adder; the output from the adder is integrated by an integrator; and the output voltage from the integrator is applied as a sweep voltage to the oscillator, thereby automatically maintaining the oscillation frequency thereof at a predetermined value. The analysis of the operation of the oscillator may be much facilitated, and when used as an automatic channel selector for a television receiver, a high speed automatic channel selection may be ensured.

12 Claims, 20 Drawing Figures

FIG. 3
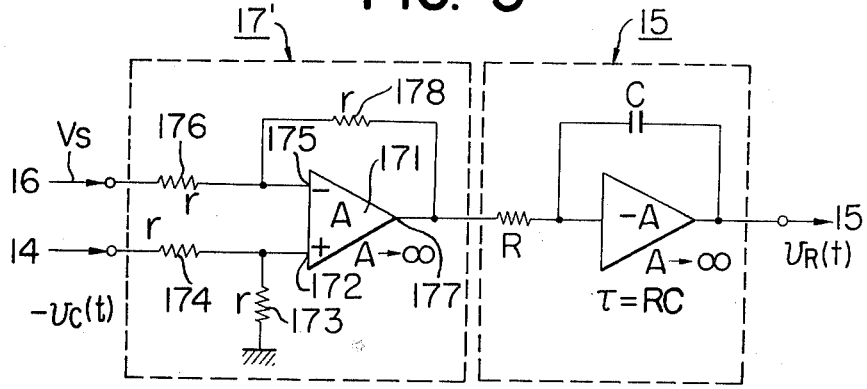
FIG. 4
(a)
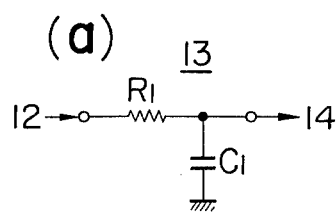
(b)
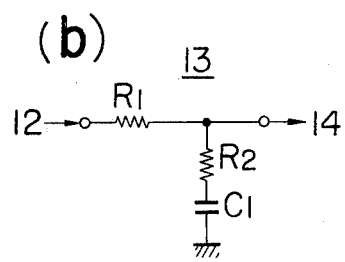
(c)
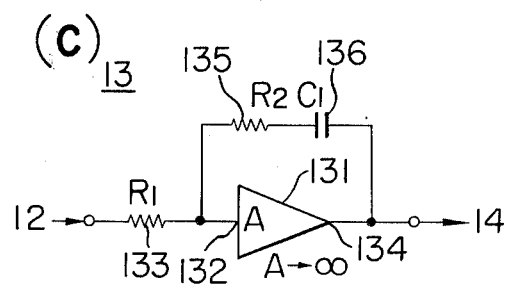

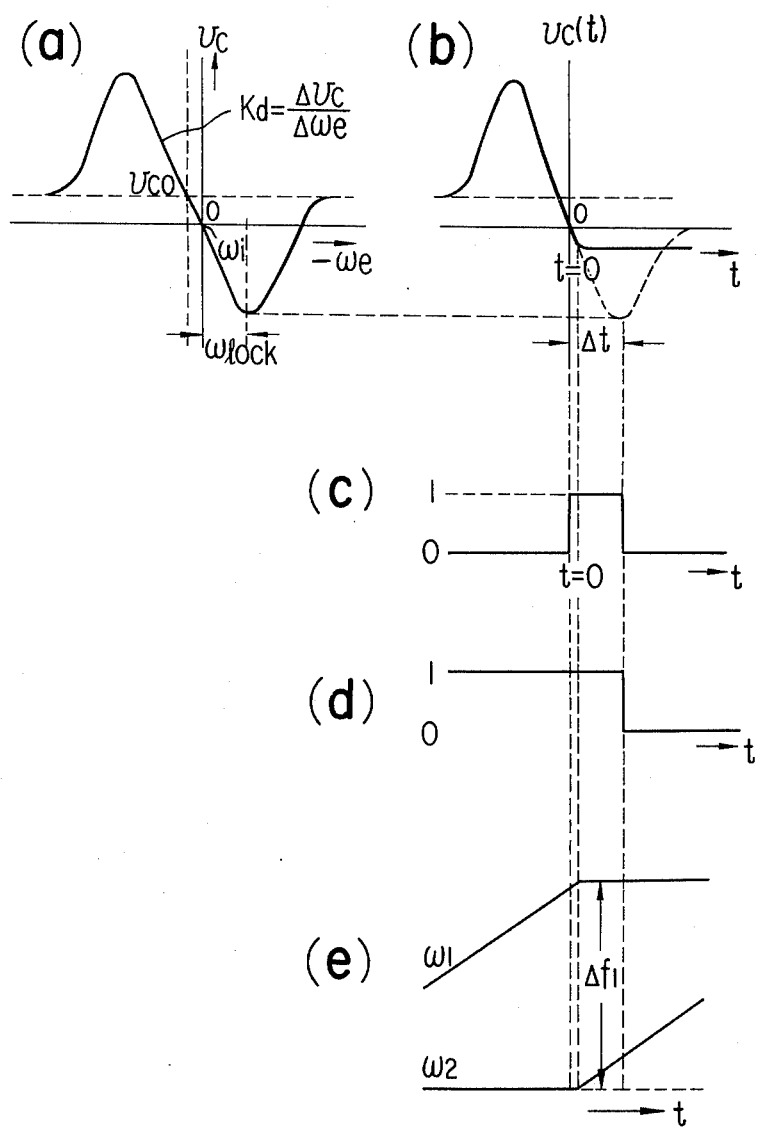

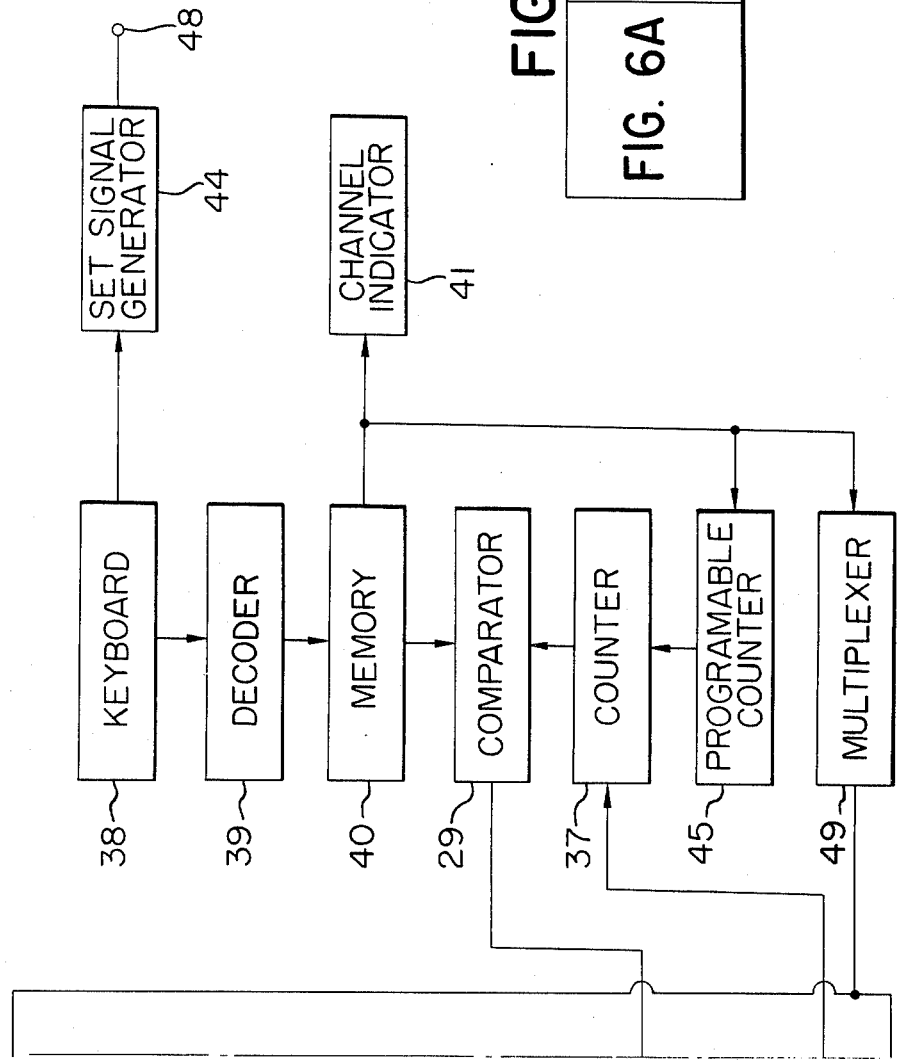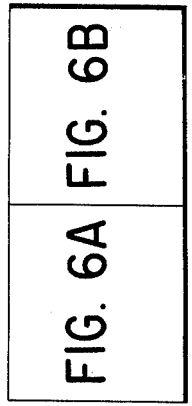

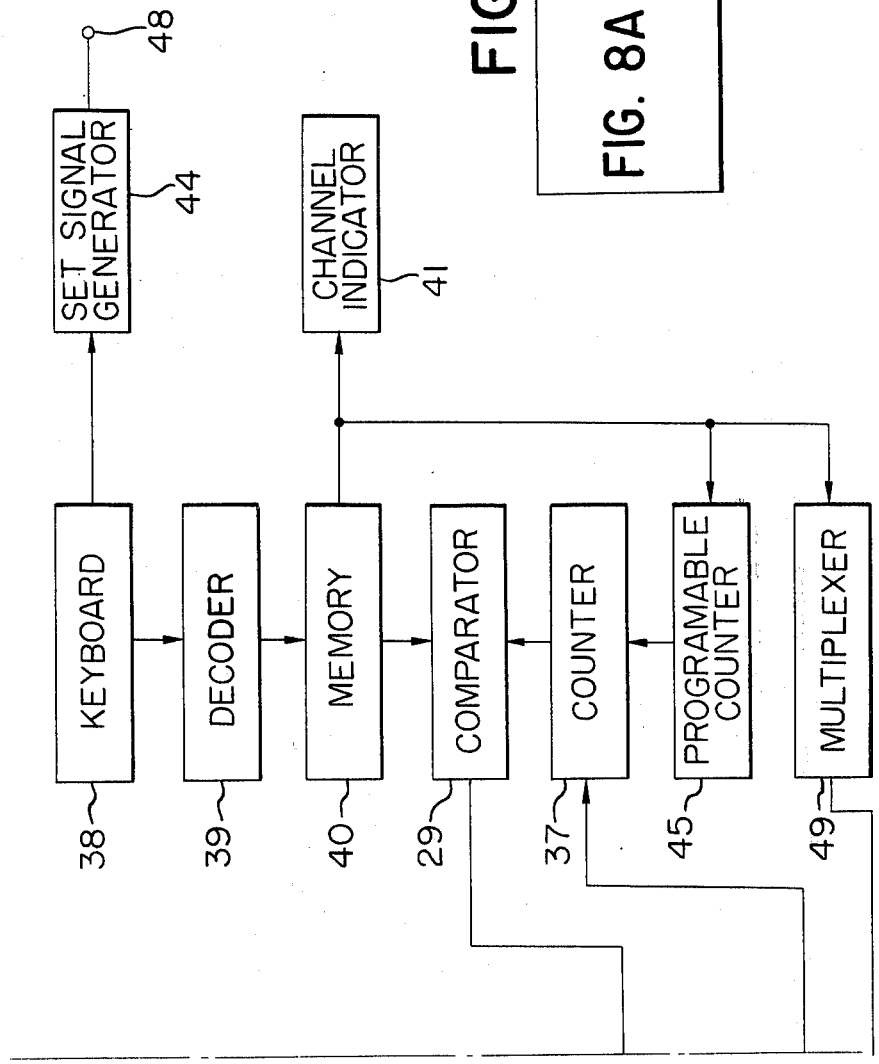

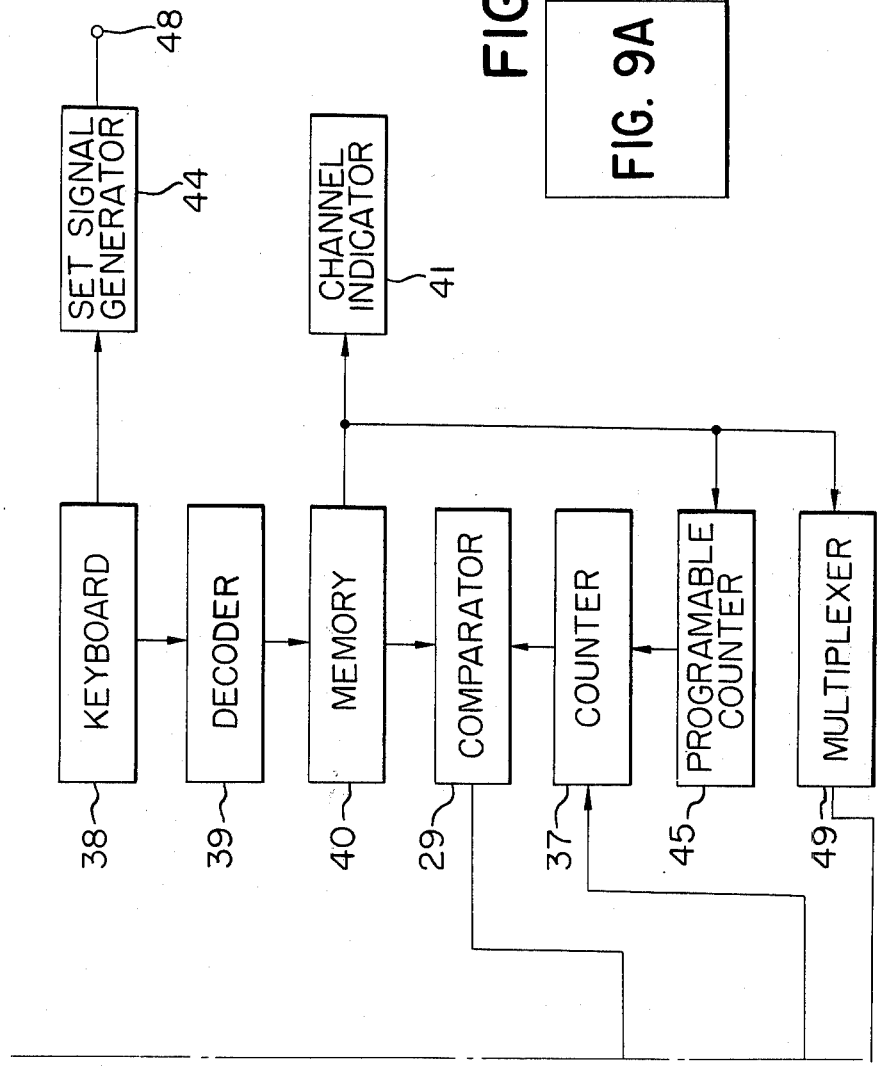
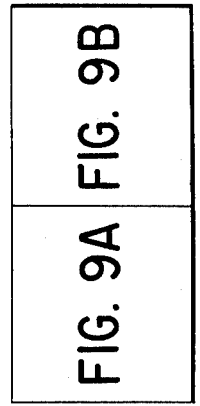

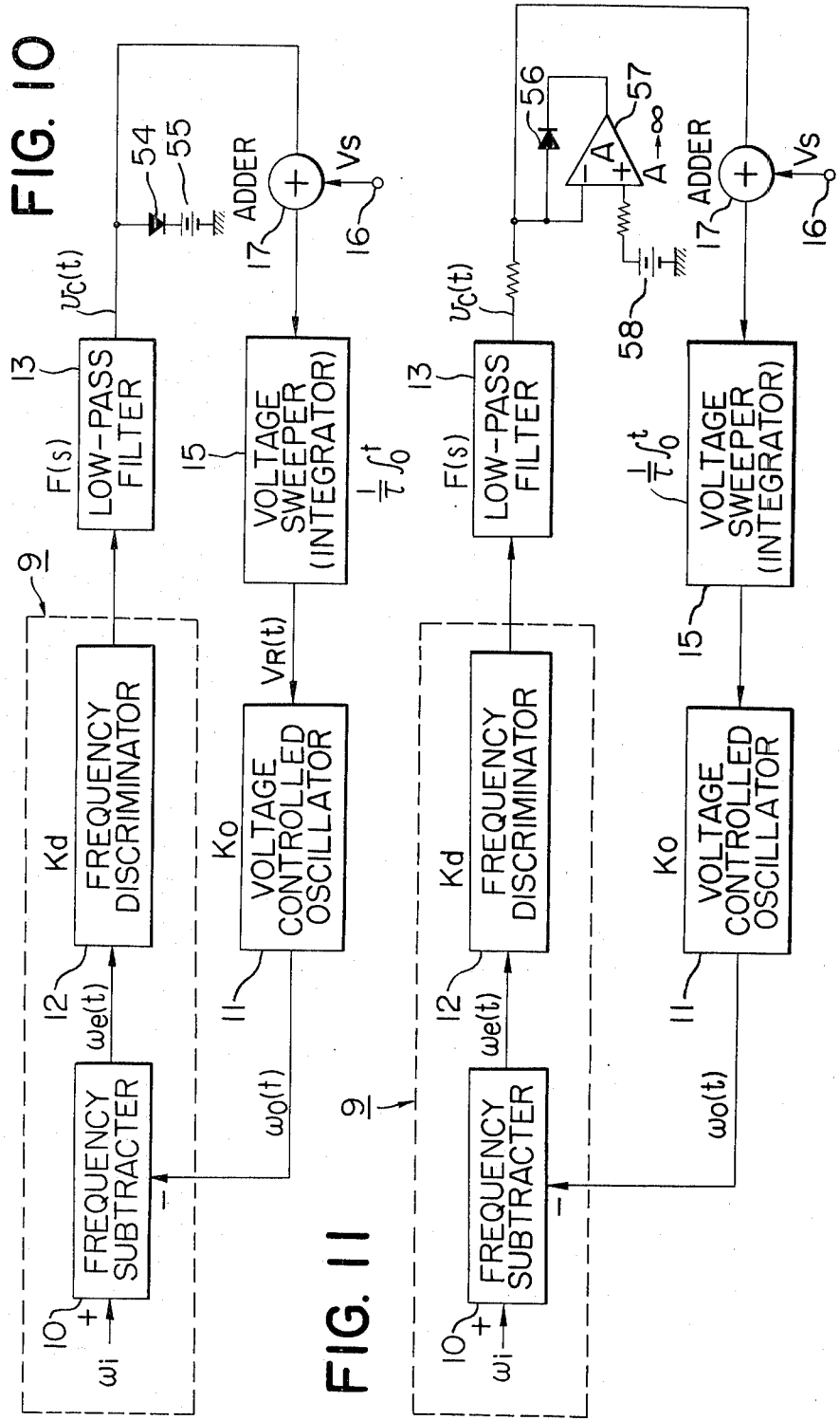

SEARCH TYPE TUNING DEVICE

BACKGROUND OF THE INVENTION

The present invention relates to a search type tuning device of the type using a voltage-controlled oscillator for automatically tuning its oscillation frequency to a predetermined frequency.

In the conventional so-called search type tuning devices, the input signal is amplified by a high frequency amplifier, and is converted by a mixer with the output from a local oscillator into an intermediate frequency signal. The intermediate frequency signal passes through a frequency discriminator, a low-pass filter and a voltage sweep control circuit and is applied to a voltage sweeper or voltage sweeping circuit to control it. When the local oscillator sweeps its oscillation frequency to a predetermined frequency, the voltage sweep is stopped so that the desired input signal is selected and received. However, in the conventional search type tuning devices of such type as described, a voltage sweep control circuit has non-linear characteristics so that the analysis of the tuning device for determining the characteristics thereof is difficult. Furthermore, they have an undesirable characteristic in that a high speed search tuning cannot be attained.

SUMMARY OF THE INVENTION

One of the objects of the present invention is therefore to provide a search type tuning device which may substantially overcome the undesirable effects encountered in the conventional search type tuning devices.

Another object of the present invention is to provide a search type tuning device whose characteristics may be analyzed in a simple manner, so that its highly reliable, dependable and accurate operation may be ensured.

A further object of the present invention is to provide a search type tuning device which may be advantageously used as a high-speed and accurate automatic channel selector for a television receiver or the like.

According to one aspect of the present invention, a frequency subtractor is used to derive the intermediate frequency signal from the received signal with a predetermined frequency and from the output of a frequency sweep type local oscillator. The output from the frequency subtracter is applied to a frequency discriminator whose output is, in turn, applied to a low-pass filter. The output from the low-pass filter and a predetermined sweep driving voltage are added by a linear adder. The output from the adder is integrated by an integrator, and the output from the integrator is applied as a control voltage to a voltage-controlled oscillator so as to control its oscillation frequency.

According to the present invention, the low-pass filter may be of active or passive type.

According to another aspect of the present invention, a clamping circuit is interconnected between the low-pass filter and the adder so that the output from the low-pass filter may be applied to the adder only when the output from the low-pass filter exceeds a predetermined value.

In order to ensure the proper operation, the present invention uses a clamping circuit of the type consisting of an operational amplifier with a diode interconnected between its input and output terminals.

The features and advantages of the present invention may be summarized as follows:

1. Since a frequency lock system is used, the analysis of transient characteristics may be such facilitated. Therefore, a search type tuning device with a desired sweeping speed as well as an automatic channel selector capable of selecting a desired channel at an extremely high speed may be designed. Moreover, the tuning device in accordance with the present invention is best adapted for use as a frequency sweep generator of the type intermittently repeating the frequency sweep and stop sweeping for many times.

2. The frequency error in steady state operation of the frequency lock system is made independent of the sensitivity of the voltage-controlled oscillator so that a variation in frequency error due to the change in sweeping frequency may be prevented and that the frequency error may be corrected in a simple manner. In the conventional automatic frequency control systems, the sensitivity of the voltage-controlled oscillator changes depending upon the voltage impressed across a variable-capacity diode.

3. The frequency error in the steady state operation of the frequency lock system may be made zero when an active type low-pass filter is used. Therefore, when the tuning device according to the present invention is used as an automatic channel selector for a television receiver in which the frequency sweep is intermittently carried out for many times, the integrated error may be eliminated. This is particularly advantageous when the device is used as an automatic channel selector for a UFH television receiver. In conventional automatic frequency control systems and automatic channel selectors, the frequency error cannot be made zero in the steady state.

4. The search type tuning device in accordance with the present invention may be used as an automatic channel selector so that full-electronic channel selection may become possible without the channel selection voltage being preset by a variable resistor. Therefore, full use of advantages of the channel selector of the type using a variable-capacity diode as a contactless tuner may be possible.

5. A counter and a multiplexer may be incorporated so that the sweep of undsired bands may be skipped according to a program, thus resulting in an extremely high speed channel selection.

6. A clamping circuit may be used as a unit step voltage generator so that the circuit design may be greatly simplified.

7. In the search type tuning device of the type using two sweep generators which are alternatively actuated, an additional local oscillator may be provided so that a predetermined difference frequency between the oscillation frequencies of the sweep generators may be directly detected. This arrangement is advantageous in that only one frequency discriminator may be used and that the circuit operation may be stabilized.

8. The clamping circuit of the type consisting of an operational amplifier with a diode interconnected between its input and output terminals may ensure the linear characteristics of the frequency lock system.

BRIEF DESCRIPTION OF THE DRAWINGS:

FIG. 3 is a circuit diagram of an adder and an integrator thereof;

FIGS. 4a, 4b and 4c are circuit diagrams of low-pass filters thereof;

FIG. 5 shows diagrams used for the explanation of the mode of operation thereof;

FIGS. 10, 11 and 12 are circuit diagrams of a clamping circuit used in the search type tuning device shown in FIG. 2.

Identical reference numerals are used to designate similar parts throughout the figures.

Figure 1:
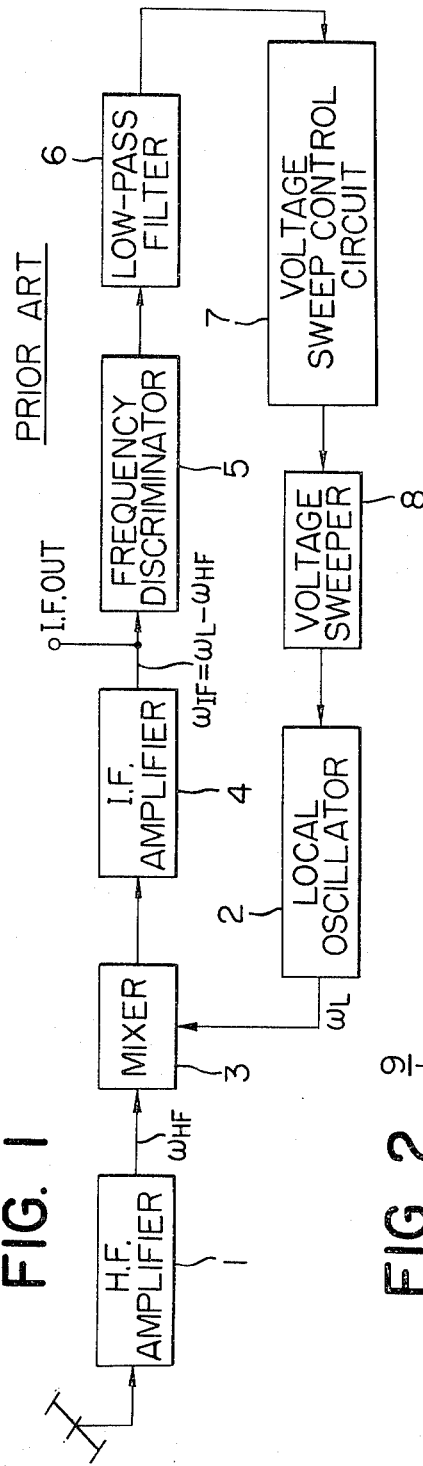
FIG. 1 is a block diagram of a conventional search type tuning device.

DESCRIPTION OF THE PREFFERED EMBODIMENTS:

Prior Art, FIG. 1

Prior to the description of the preferred embodiments of the present invention, one conventional automatic channel selector will be described with reference to FIG. 1 for the sake of better understanding of the present invention. The input signal which is amplified by a high frequency amplifier 1 is mixed in a mixer 3 with the output from a local oscillator 2 so that an intermediate frequency output signal with a frequency difference between the frequency of the input signal and the frequency of the output from the local oscillator 2 may be produced. The output from the mixer 3 is amplified by an intermediate frequency amplifier 4, and the output from the amplifier 4 is discriminated by a frequency discriminator 5. The output from the discriminator 5 is transmitted through a low-pass filter 6 and a voltage sweep control circuit 7 to a voltage sweeper or voltage sweep generator 8. When the local oscillator 2 sweeps its oscillation frequency to a desired frequency and a desired intermediate frequency signal is detected, the voltage sweeper 8 stops its sweeping so that the desired input signal may be continuously received.

The Invention, First Embodiment

Figure 2:
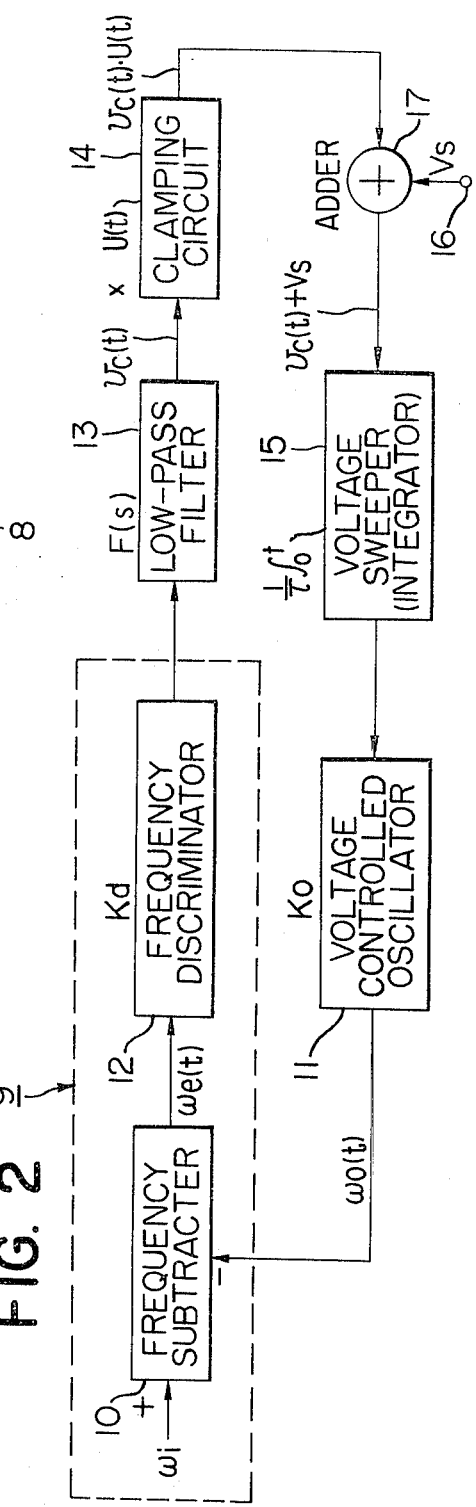
FIG. 2 is a block diagram of a first embodiment of a search type tuning device in accordance with the present invention.

Referring to FIG. 2, a frequency discriminator stage such as a ratio detector generally indicated by 9 detects the output of the sweep oscillation frequency $107_o(t)$ from a voltage-controlled oscillator 11 so that when the sweep oscillation frequency $107_o(t)$ reaches a desired frequency $107_i$, the frequency sweep by the oscillator 11 may be stopped. In the instant embodiment, the frequency discriminator stage 9 is shown as comprising a frequency subtractor 10 and a frequency discriminator 12 in order to make it easier to analyze the operation of the frequency discriminator stage 9, but is substantially similar in construction and operation to a conventional frequency discriminator such as a ratio detector and the like. And also it is shown in the instant embodiment that the frequency subtractor 10 is so arranged as to derive the frequency difference $\omega_e(t) = \omega_i(t) - \omega_o(t)$, i.e. the frequency difference between a desired frequency $\omega_i$ of a reference signal and the frequency $\omega_o(t)$ from the voltage-controlled oscillator 11, and the frequency discriminator 12 is so arranged as to produce the voltage in proportion to the difference frequency $\omega_e(t)$. In the conventional television receiver, the voltage-controlled oscillatr 11 may be made up of a local oscillator and a mixer, and an intermediate frequency of the output from the mixer may be the frequency $\omega_o(t)$ of the output from the oscillator, in this case the intermediate frequency being swept as the oscillation frequency of the local oscillator is swept, while the reference frequency $\omega_i$ may be a predetermined intermediate frequency.

When the first embodiment shown in FIG. 2 is compared with the conventional automatic channel selector of the type shown in FIG. 1, it is seen that the output frequency $\omega_{IF}$ from the intermediate frequency amplifier 4 is equivalent to the output frequency $\omega_o(t)$ from the voltage-controlled oscillator 11 shown in FIG. 2. Instead of the frequency discriminator 5 shown in FIG. 1, the first embodiment employs the frequency discriminator 12 of the type for discriminating the frequency difference between the reference frequency $\omega_1$ and the output frequency $\omega_o(t)$ from the voltage-controlled oscillator 11. The frequency discriminator 12 is connected to a low-pass filter 13 which in turn is connected to a clamping circuit 14 which multiplies the output voltage $v_c(t)$ from the low-pass filter 13 by the unit step function $U(t)$ to obtain the product $v_c(t) \cdot U(t)$ so that the search type tuning device shown in FIG. 2 may become an open-loop system when time $t < 0$ but may become a closed-loop system when time $t \geq 0$, assuming that when $t < 0$, the output sweep frequency $\omega_o(t)$ increases from a low frequency to a higher frequency. The sweeping voltage is applied to the oscillator 11 from an integrator 15 whose input is connected to an adder 17 which adds a predetermined sweep driving voltage $V_s$ (applied at an input terminal 16) to the output $v_c(t) \cdot U(t)$ from the clamping circuit 14. The adder 17 may be a conventional operational amplifier type as shown in FIG. 3. In FIG. 3, instead of the adder 17, a subtractor 17' may be used, and the output $-v_c(t)$ from the low-pass filter 13 is applied to the positive input terminal thereof. More particularly, the subtractor 17' comprises an operational amplifier 171 whose positive input terminal 172 is grounded through a resistor 173 and is connected through a resistor 174 to the output terminal of the clamping circuit 14 for applying the voltage $-v_c(t) \cdot U(t)$ therefrom. A negative input terminal 175 is connected through a resistor 176 to the input terminal 16 for deriving voltage $V_s$, and is connected through a resistor 178 to an output terminal 177 of the operational amplifier.

Next the underlying principle of the search type tuning device in accordance with the present invention will be described hereinafter.

Assuming that the variation, or the variation factor $K_o$, of the output frequency $\omega_o(t)$ of the oscillator 11 to that of the input voltage $v_R(t)$ thereof be constant when the variation $\Delta v_R(t)$ in the input voltage $v_R(t)$ is very small and that the initial condition be $\omega_i - \omega_o(o) = 0$ when $t = 0$, when the following relations are held:

$$\frac{d\omega_o(t)}{dt} = K_o \frac{dv_R(t)}{dt} \qquad (1)$$

$$v_R(t) = \frac{1}{\tau} \int_0^t \{v_o(t) + V_s\} dt + v_R(0) \qquad (2)$$

$$v_o(t) = K_d \int_0^t f(t-u)\{\omega_i - \omega_o(u)\} du + v_o(0) \qquad (3)$$

where $v_c(0) = 0$ at $t = 0$,
 $f(t)$ : impulse response of the low-pass filter 13,
 $K_d$ : sensitivity of the frequency discriminator 12, and
 $\tau$: time constant (= RC) of the integrator 15.
Therefore, $$\frac{d\omega_o(t)}{dt} = \frac{K_o V_s}{\tau} + \frac{K_o K_d}{\tau} \int_0^t f(t-u)\{\omega_i - \omega_o(u)\} du \qquad (4)$$

Substituting $\omega_e(t) = \omega_i - \omega_o(t)$, into Eq. (4), we have $$\frac{d\omega_r(t)}{dt} + \frac{K_o K_d}{\tau} \int_0^t f(t-u)\omega_e(u) du = -\frac{K_o V_s}{\tau} \qquad (5)$$

Let $$\omega_1(t) = \omega_i - \left\{ \frac{K_o}{\tau} \int_0^t V_s dt + \omega_i \right\} \qquad (6)$$

and $$\omega_2(t) = \omega_o(t) - \left\{ \frac{K_o}{\tau} \int_0^t V_s dt + \omega_i \right\} \qquad (6')$$

then $$\frac{d\omega_e(t)}{dt} + \frac{K_o K_d}{\tau} \int_0^t f(t-u)\omega_e(u) du = \frac{d\omega_1(t)}{dt} \qquad (7)$$

where $\omega_e(t) = \omega_1(t) - \omega_2(t)$.

Eq. (7) is a fundamental equation used many times in this specification for the explanation of the operation of the search type tuning device or automatic channel selector in accordance with the present invention. Eq. (7) is transformed by the Laplace transformation to $$\left\{ s + \frac{K_o K_d F(s)}{\tau} \right\} \Omega_e(s) = s \Omega_1(s) \qquad (8)$$

Accordingly, $$\Omega_e(s) = \frac{s \Omega_1(s)}{s + \frac{K_o K_d F(s)}{\tau}}$$

$$= \frac{-\frac{K_o V_s}{\tau_s}}{s + \frac{K_o K_d F(s)}{\tau}} \qquad (9)$$

The transient characteristic of the frequency sweep oscillator when it is locked to a predetermined frequency may be expressed in terms of $\omega_e(t)$ by the inverse transform of Eq. (9). When low-pass filters $F_1(s)$, $F_2(s)$ and $F_3(s)$ of the types shown in FIGS. 4a, b and c, respectively, are used (where $R_1 C_1 = t_1$ and $R_2 C_1 = t_2$), $\omega_e(t)$ are as follows: when $\zeta > 1$ $$\omega_e(t) = -\frac{\dot{\omega}_s}{\omega_n} \left[ \alpha + \epsilon^{-\zeta \omega_n t} \left\{ \frac{1 - \alpha \zeta}{\sqrt{\zeta^2 - 1}} \sinh\left(\omega_n t \sqrt{\zeta^2 - 1}\right) \right. \right.$$

$$\left. \left. - \alpha \cosh\left(\omega_n t \sqrt{\zeta^2 - 1}\right) \right\} \right] \qquad (10)$$

when $\zeta = 1$ $$\omega_e(t) = \frac{\dot{\omega}_s}{\omega_n} [\alpha + \epsilon^{-\omega_n t}\{\omega_n t - \alpha(1 + \omega_n t)\}] \qquad (11)$$

when $\zeta < 1$ $$\omega_e(t) = -\frac{\dot{\omega}_s}{\omega_n} \left[ \alpha + \epsilon^{-\zeta \omega_n t} \left\{ \frac{1 - \alpha \zeta}{\sqrt{1 - \zeta^2}} \sinh\left(\omega_n t \sqrt{1 - \zeta^2}\right) \right. \right.$$

$$\left. \left. - \alpha \cosh\left(\omega_n t \sqrt{1 - \zeta^2}\right) \right\} \right] \qquad (12)$$

where $\omega_s = K_o V_s/t$ = sweeping speed of oscillation frequency of oscillator 11 in opened loop;
 $\zeta$ : attenuation constant;
 $\omega_n$ : natural frequency; and
 $\alpha$ : coefficient depending upon a low-pass filter used, and is $2\zeta$, $2\zeta - \omega_n \tau_2$ and 0, respectively when the low-pass filters $F_1(s)$, $F_2(s)$ and $F_3(s)$ are used.
The above characteristic parameters $\zeta, \omega_{n1}$ and $\alpha$ are given in terms of the circuit parameters $\tau, \tau, \tau_2, K_o$ and $K_d$ as shown in Table below:

|  | FIG. 4a | FIG. 4b | FIG. 4c |
|---|---|---|---|
| $F(s)$ | $F_1(s) = \dfrac{1}{s\tau_1 + 1}$ | $F_2(s) = \dfrac{s\tau_2 + 1}{s(\tau_1 + \tau_2) + 1}$ | $F_3(s) = \dfrac{s\tau_2 + 1}{s\tau_1}$ |
| $\zeta$ | $\dfrac{1}{2}\sqrt{\dfrac{\tau}{K_o K_d \tau_1}}$ | $\dfrac{1}{2}\sqrt{\dfrac{K_o K_d}{\tau(\tau_1 + \tau_2)}} \left(\tau_2 + \dfrac{\tau}{K_o K_d}\right)$ | $\dfrac{\tau_2}{2}\sqrt{\dfrac{K_o K_d}{\tau \tau_1}}$ |
| $\omega_n$ | $\sqrt{\dfrac{K_o K_d}{\tau \tau_1}}$ | $\sqrt{\dfrac{K_o K_d}{\tau(\tau_1 + \tau_2)}}$ | $\sqrt{\dfrac{K_o K_d}{\tau \tau_1}}$ |

-continued

| FIG. 4a | FIG. 4b | FIG. 4c |
|---|---|---|
| $\alpha$ | $\sqrt{\dfrac{\tau}{K_o K_d \tau_1}}$ | $\sqrt{\dfrac{\tau}{K_o K_d (\tau_1 + \tau_2)}}$ | 0 |

In general, the parameters $K_o$ and $K_d$ for practical use are given. Accordingly, the suitable circuit parameters $\tau$, $\tau_1$ and $\tau_2$, for obtaining any desired characteristic parameters $\zeta, \omega_n$ and $\alpha$, can well be determined.

When the value of the characteristic parameters $\tau, \omega_n$ and $\alpha$ are determined, the input frequency $\omega_e(t)$ of the input signal to the frequency discriminator 12 increases in proportion to the increase in $\dot{\omega}_s$, and when the input frequency $\omega_e(t)$ exceeds the locking frequency $\omega_{lock}$ of the frequency discriminator, no negative feedback is applied to a frequency locking system, so that the frequency lock cannot be attained. (See FIG. 5a).

When the oscillator 11 sweeps its oscillation frequency in such a manner that the input frequency $\omega_e(t)$ does not exceed the frequency lock limit $\omega_{lock}$, the output frequency $\omega_o(t)$ of the oscillator 11 reaches the steady state through a transient state as indicated in full line below-right the origin in FIG. 5b. This is the transient characteristic as indicated by the above equations (10) and (12).

The steady state may be expressed in the term of $\Omega_e(s)$ of Eq. (9)

$$\omega_e = \lim_{t \to \infty} \omega_e(t) = \lim_{s \to 0} s \cdot \Omega_e(s) \qquad (13)$$

When the low-pass filters $F_1(s)$ and $F_2(s)$ shown in FIGS. 4a and 4b are used, $$\omega_e = -V_s/K_d \qquad 14.$$

and when the low-pass filter $F_3(s)$ is used, $$\omega_e = 0 \qquad 15.$$

It should be noted that in the steady state the frequency error $\omega_e$ is independent of the sensitivity $K_o$ of the voltage-controlled oscillator 11, but is only dependent of the sensitivity $K_d$ of the frequency discriminator and the sweep driving voltage $V_s$ in case of the passive filters such as low-pass filters $F_1(s)$ and $F_2(s)$ shown in FIGS. 4a and 4b, respectively, and that the frequency error $\omega_e$ is zero in case of the active filter such as the low-pass filter $F_3(s)$.

Referring back to FIG. 4c, the active filter comprises an operational amplifier 131 whose input terminal 132 is connected to the output terminal 134 thereof through a resistor 135 and a capacitor 136 and to the output terminal of the frequency discriminator 12 through a resistor 133.

According to the first embodiment of the present invention, the adder 17 which consists of the operational amplifier is inserted between the clamping circuit 14 and the voltage sweeper or integrator 15 so that the output voltage $v_c(t)$ from the low-pass filter 13 may be superimposed upon the sweep driving voltage $V_s$. Accordingly the analysis of the search type tuning device may be remarkably facilitated. Therefore, in its design, one may take into consideration such various design factors as a transient times; i.e., a time interval from the time when the desired receiving signal is detected to the time when the output frequency $\omega_o(t)$ is locked, conditions for attaining the frequency lock, a permissable frequency error or distortion in the steady state, and so on. The adder 17 may be of any type as far as it may superimpose the output voltage $v_c(t)$ on the sweep driving voltage $V_s$.

Next the mode of operation of the search type tuning device with the above construction will be described hereinafter. The tuning device comprises a first frequency sweep oscillator, a second frequency sweep oscillator and means for detecting the frequency difference between the oscillation frequencies of the first and second frequency sweep oscillators. The first and second frequency sweep oscillators are so constructed that one of the two oscillators is in frequency sweeping state while another oscillator is oscillating in a constant frequency. It further comprises means for reversing the mode of frequency sweeping of the two oscillators when the frequency difference between the first and second frequency sweep oscillators reaches a first predetermined value while the first frequency sweep oscillator is in a sweeping state, and also similarly, for reversing the mode of sweeping when the frequency difference between the two oscillators reaches a second predetermined value while the second oscillator is in a sweeping state; and vice versa. The reception of a desired channel is locked when the number of operation reversals between the first and second frequency sweep oscillators reaches a predetermined number.

The present invention has for its object to provide a search type tuning device in which the high speed alternate operation of the first and second frequency sweep oscillators is controlled with a higher degree of accuracy by the system of the type described above. One embodiment of the present invention will be described in detail hereinafter with reference to the accompanying drawings.

Figure 6A:
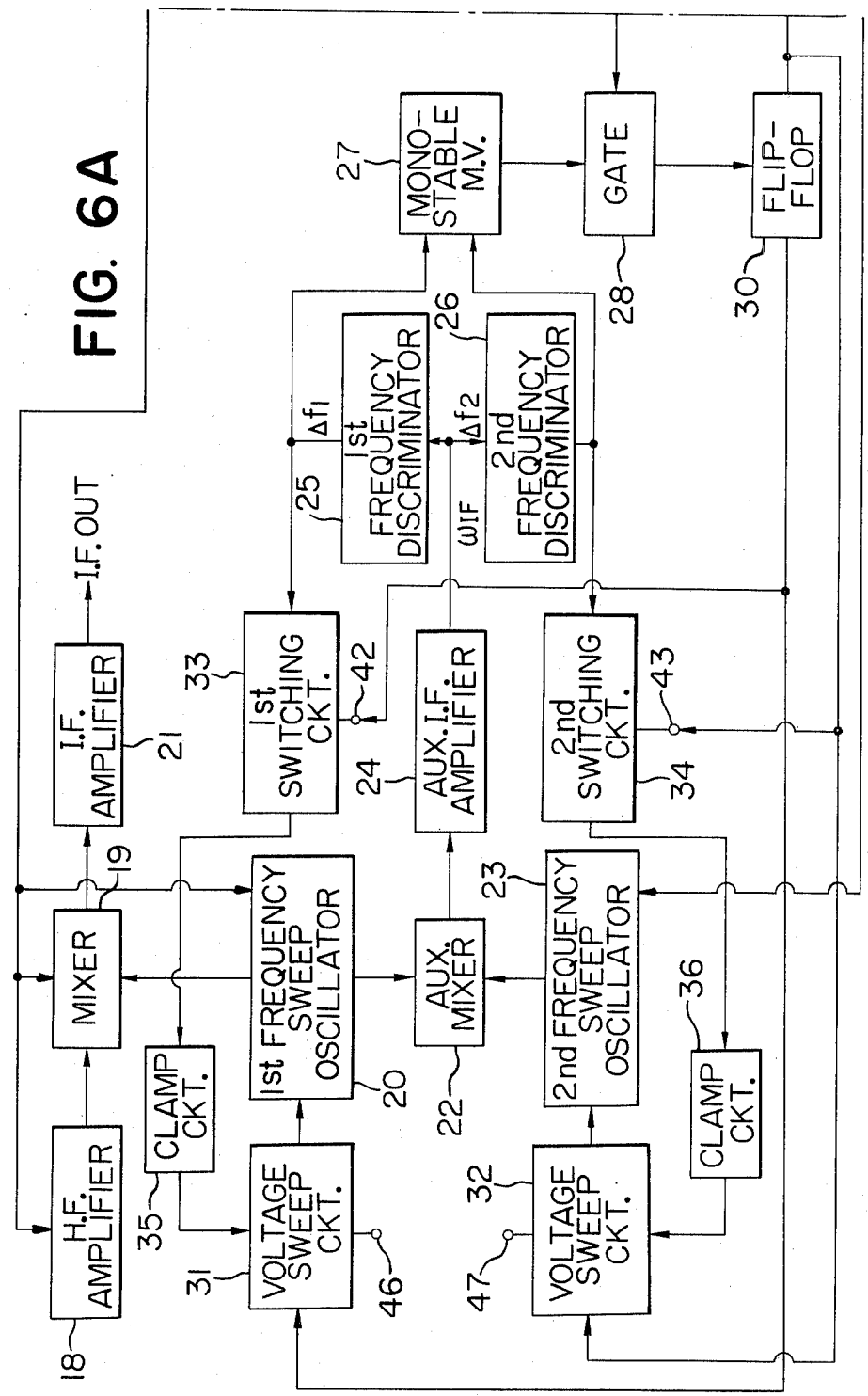
FIG. 6 includes FIGS. 6A, 6B and is a block diagram of a first embodiment of an automatic channel selector incorporating a search type tuning device in accordance with the present invention.

First referring to FIG. 6, reference numeral 18 denotes a high frequency amplifier; 19, a mixer; 20, a first frequency sweep oscillator which also functions as a local oscillator in a tuner; 21, an intermediate frequency amplifier; 22, an auxiliary mixer; 23, a second frequency sweep oscillator; 24, an auxiliary intermediate frequency amplifier; 25, a first frequency discriminator; 26, a second frequency discriminator; 27, a monostable multivibrator for producing one pulse with a predetermined pulse duration when the output voltage from the first or second frequency discriminator 25 or 26 reaches the output voltage $v_c(0)$ from a low-pass filter in a frequency discriminator at $t = 0$ as will be described in detail hereinafter; 28, a gate circuit which is controlled in response to the output from a comparator 29; 30, a flip-flop circuit which is so arranged as to be set in response to the trailing edge of the output pulse from the monostable multivibrator 27; 31, and 32, voltage sweep oscillators which are controlled in response to the output from the flip-flop 30; 33, a first switching circuit for opening or closing a frequency locking loop consisting of the circuits 20, 22, 24, 25, 33 and 31; 34, a second switching circuit for opening or closing a frequency locking loop consisting of the circuits 23, 22, 24, 26, 34 and 32; and 35 and 36, clamping circuits.

The output frequency $\omega_{IF}$ from the auxiliary intermediate frequency amplifier 24 corresponds to the output frequency $\omega_o(t)$ from the voltage-controlled oscillator shown in FIG. 2. The frequency discriminators 25 and 26 correspond to the frequency discriminator stage 9 shown in FIG. 2 for discriminating the difference between the reference frequency $\omega_i$ and the output frequency $\omega_o(t)$ from the voltage-controlled oscillator 11. The low-pass filter 13 shown in FIG. 2 is incorporated in each of the frequency discriminators 25 and 26. As is clear from the above description, the system shown in FIG. 2 has been so far described as a model for analyzing the operation of the two frequency locking loops in FIG. 6. The combination of the integrator 15, the sweep driving voltage source 16 and the adder 17 shown in FIG. 2 corresponds to the voltage sweep circuit 31 or 32.

Referring back to FIGS. 5b, c, d and e, FIG. 5b is a time chart used for the explanation of the output from the low-pass filter in the frequency discriminators 25 and 26; FIG. 5c, a time chart of the output pulse from the monostable multivibrator 27; FIG. 5d, a time chart of the output from the flip-flop 30; and FIG. 5e, a time chart used for the explanation of the relation between the oscillation frequencies $\omega_1$ and $\omega_2$ of the first and second sweep oscillators. The transient time with transient characterisctics expressed by Eqs. (10), (11) and (12) is sufficiently made smaller than $\Delta t$ shown in FIG. 5b. As shown in FIGS. 5c and 5d, the flip-flop 30 reverses its operation mode at the trailing edge of the pulse c, so that when the mode of operations of the first and second frequency sweep oscillators 20 and 23 are reversed, the difference between the oscillation frequencies thereof is accurately locked to a predetermined frequency $\Delta f_1$.

Figure 7:
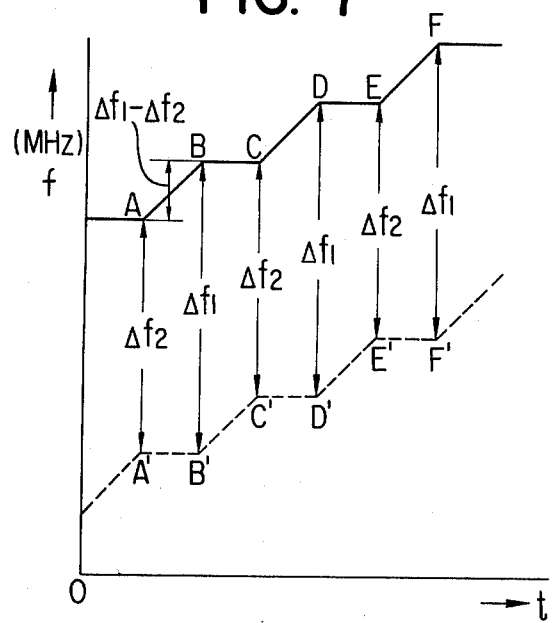
FIG. 7 is a diagram used for the explanation of the mode of operation thereof.

FIG. 7 shows the mode of alternate frequency sweep by the first and second sweep oscillators 20 and 30, $\Delta f_1$ and $\Delta f_2$ being the reference frequencies for the first and second frequency discriminators 25 and 26, respectively. The solid line curve indicates the oscillation frequency of the first frequency sweep oscillator 20 while the dotted line curve, the oscillation frequency of the second frequency sweep oscillator 23. It is assumed that the channel selector be activated when the first sweep oscillator 20 is deactivated to sweep while the second sweep oscillator 23 is activated to sweep with the difference frequency between them being between $\Delta f_1$ and $\Delta f_2$. When the difference frequency between the first and second sweep oscillators 20 and 23 reaches $\Delta f_2$ assuming that $\Delta f_1$ and $\Delta f_2$ be within the band of the auxiliary intermediate frequency amplifier 24, the monostable multivibrator 27 produces the output pulse as shown in FIG. 5c. At the trailing edge of this output pulse, the flip-flop 30 is reversed its operation mode so that the modes of operations of the first and second frequency sweep oscillators 20 and 23 are reversed. That is, the first sweep oscillator 20 is activated to sweep its oscillation frequency while the second sweep oscillator 23 is deactivated as shown at points A and A' in FIG. 7. When the oscillation frequency of the first sweep oscillator 20 reaches the point B, the frequency difference becomes $\Delta f_1$. The mode of alternate reversing operations of the first and second frequency sweep oscillators 20 and 23 are described with reference to FIGS. 5b to 5e. In like manner, the first and second sweep oscillators 20 and 23 are alternatively activated and deactivated, and these reversing modes of operation are repeated every time when the frequencies reach the points C, C'; D, D'; . . . as shown in FIG. 7.

Assume that the difference between $\Delta f_1$ and $\Delta f_2$ be equal to the channel bandwidth of 6 MHz in MTSC system. Then, the frequency difference ($\Delta f_1 - \Delta f_2$) between the frequency at A and the frequency between B and C of the first frequency sweep oscillator 20 equals the channel bandwidth 6 MHz. If the frequency at the point A is accurately assigned, the sweep-rest intervals BC, DE, . . . in constant frequency oscillation are spaced apart from each other by the channel bandwidth. The frequency during each of the sweep-rest intervals FC, DE, . . . is used as a reference frequency for reception of each television channel. In order to count the channel numbers, the output from the flip-flop 30 is applied to a counter 37.

Next means for interrupting the frequency sweep by the first sweep 20 at the frequency corresponding to a desired channel and for displaying the selected channel will be described. When a desired channel number is entered by using a keyboard 38, the output from the keyboard 38 is transferred through a decoder 39 into a memory 40. When the comparator 29 detects that the content in the memory 40 coincides with the content in the counter 37, it produces the coincidence signal, but when the contents do not coincide with each other, it produces the non-coincidence signal. When the coincidence signal is impressed to the gate 28, the gate is closed but when the non-coincidence signal is applied it is opened. Therefore, when the oscillation frequency of the first sweep oscillator reaches a frequency corresponding to the desired channel number entered by the keyboard 38, the reversal of the operation of the flip-flop 30 is interrupted, so that the alternate frequency sweep operations of the first and second frequency sweep oscillators 20 and 23 may be stopped. A channel indicator 41 displays the content in the memory 40; that is, the channel number. The output from the flip-flop 30 is applied to terminals 42 and 43 so that the switching circuits 33 and 34 may be alternately activated. Reference numeral 44 denotes a circuit for producing the set signal for setting the voltage sweep oscillators 31 and 32 and the counters 37 and 45 when the key on the keyboard 38 is depressed; 46 and 47, terminal for receiving the set signal from the output terminal 48 of the set signal generator 44; 45, a programable counter which is actuated in response to the output from the memory 40; and 49, a multiplexer which is actuated in response to the output from the memory 40. In general, the television channels consist of a high VHF band, a low VHF band and an UHF band, so that it takes a long time before a desired channel is selected if the alternate mode of operations of the first and second frequency sweep oscillators is started from "Channel 1". To overcome this defect, the programable counter 45 and the multiplexer 49 are provided so that the alternate sweep may be carried out only within a band including a desired channel. More particularly, the channel numbers to be entered by the keyboard 38 (each of which is in proportion to the number of alternate sweep operations to be carried out by the two frequency sweep oscillators) are divided into the low VHF band (including 1, 2 and 3 channels), the high VHF band (including the channel numbers from 4 to 12) and the UHF band (including the channel numbers from 13 to 62) in NTSC system. As described elsewhere, a desired channel number; that is, a number of alternate sweep operations to be carried out is entered by the keyboard 38, and is stored in the memory 40. In this case, it is detected whether the desired channel number belongs to the high or lower VHF band or UHF band so that in response to the output from the programable counter 45 representing the lowest channel number (channel 1, 4 or 13) of the receiving band to be selected, the automatic channel selector starts to select the desired channel from said lowest channel number. The multiplexer 49 detects whether the desired channel stored in the memory 40 belongs to the low or high VHF band or UHF band, and switches the power source for the UHF or VHF band and the tuning elements such as coils for the low or high VHF band depending upon the selected band.

Figure 8A:
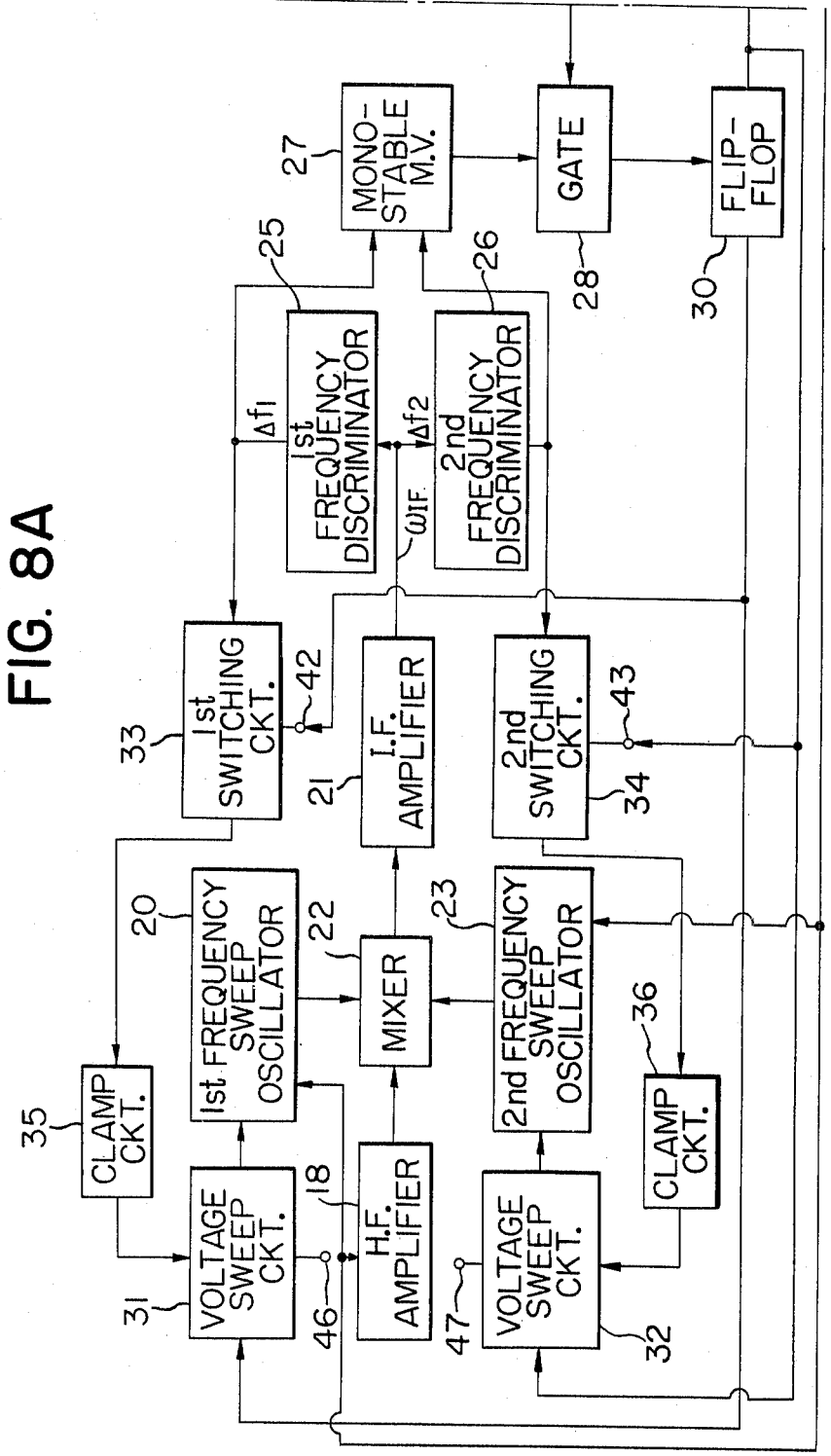
FIGS. 8 and 9 include FIGS. 8A, 8B and FIGS. 9A, 9B and are block diagrams of a second and third embodiments, respectively, of an automatic channel selector incorporating a search type tuning device in accordance with the present invention.

In the second embodiment shown in FIG. 8, instead of the main and auxiliary intermediate frequency amplifiers shown in FIG. 6, one intermediate frequency amplifier for amplifying the input signal is used to amplify the difference frequency $\Delta f$ between the first and second sweep oscillators. In the second embodiment, the amplification degree of the high frequency amplifier 18 in FIG. 6 is decreased during the time when the desired channel is selecting and until the time when the reception of the desired channel is started, and the frequency difference between A and B; B and C, . . . shown in FIG. 7 is also decreased to an integer submultiple of the channel bandwidth so that the frequency $\Delta f$ may be within the band of the main intermediate frequency amplifier.

The mode of operation of the second embodiment is substantially similar to that of the first embodiment as shown in FIG. 7, so that no description shall be made.

Figure 9A:
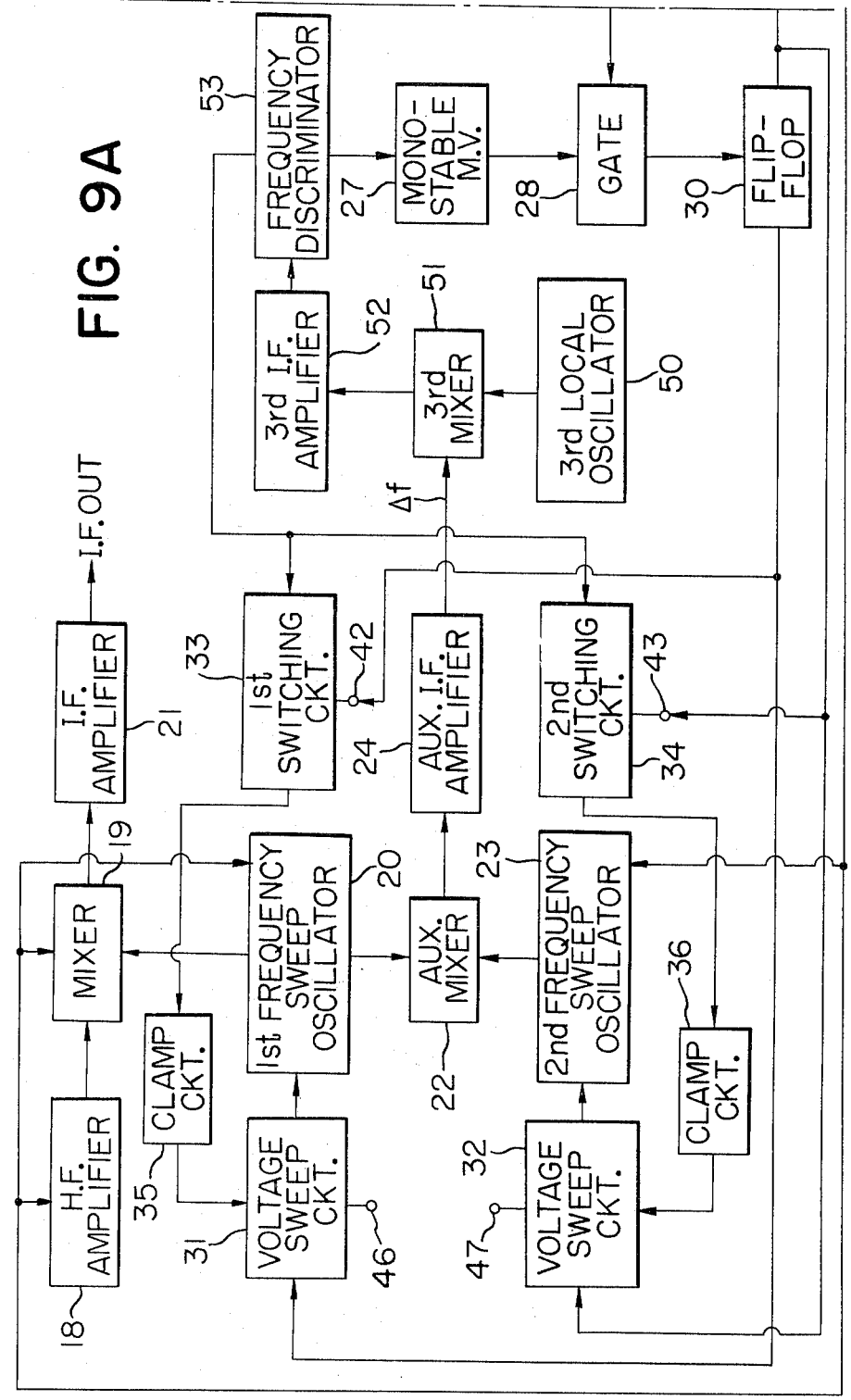

In the third embodiment shown in FIG. 9, the reference frequency of the frequency discriminator may be decreased, and instead of a plurality of frequency discriminators, only one discriminator may be used. For the sake of simplicity, the features inherent only to the third embodiment; that is, the features different from those of the first embodiment shown in FIG. 6 will be described hereinafter. Reference numeral 50 denotes an auxiliary, or third local oscillator; 51, a third mixer; 52, a third intermediate frequency amplifier; and 53, a frequency discriminator. The frequency discriminator 53 gives the output only when the frequency difference $\Delta f = f - f_o$ or $f \times f_o$, where $f$ = output frequency of the auxiliary local oscillator 50, and $f_o$ = tuning frequency of the third intermediate frequency amplifier. These frequencies corresponds to $\Delta f_1$ and $\Delta f_2$ shown in FIG. 7, so that the mode of operation of the third embodiment may be immediately understood from that of the first embodiment shown in FIG. 6.

The clamping circuit 14 shown in FIG. 2 has been described as comprising a unit function generator, but a variation as shown in FIG. 10 may be used. One terminal of a diode 54 is grounded or connected to a reference voltage source 55 while the other terminal, to the output terminal $v_c(t)$ of the low-pass filter 13. The mode of operation will be explained with reference to FIGS. 5a and 5b. When the difference frequency $\omega_e(t)$ between the oscillation frequencies of the first and second sweep oscillators increases with time, $v_c(t)$ must change as shown in FIG. 5b. Until $t = 0$ the clamping circuit 14 is actuated (when the diode 54 is grounded and is clamped to 0 volt), so that the frequency locking system has an open loop. As a result, $v_c(t)$ equals the reference voltage (0 volt when the diode 54 is grounded). When $t \geq 0$, the diode 54 is not conducted, so that the frequency locking system has a closed loop. When the output voltage $v_{co}$, in the case of no input signal being applied to the frequency discriminator, is higher than a clamping voltage 0 volt, the frequency locking system is an open loop. Therefore, when the output frequency from the frequency sweep oscillator increases from the reference frequency corresponding to one channel to the reference frequency of another channel, the frequency locking system remains in an open loop.

Figure 12:
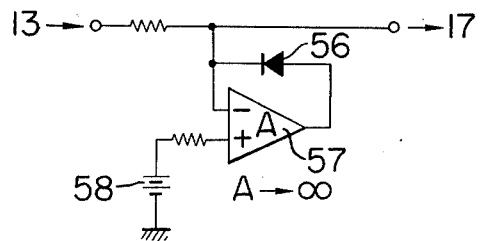

FIG. 11 shows another variation of the clamping circuit, in which a diode 56 is interconnected between the input and output terminals of an operational amplifier 57 so that the more effective clamping operation may be ensured. Depending upon whether the control voltage $v_c(t)$ is higher or lower than a reference voltage 58 during the frequency lock, the clamping circuit is activated or deactivated. Therefore, the nonlinearlity of the frequency locking loop due to the nonlinearity of the voltage-to-current characteristic curve of the diode 54 shown in FIG. 10 may be overcomed. When the control voltage $v_c(t)$ to be applied to the adder or operational amplifier 17 is reversed in polarity as shown in FIG. 3, a clamping circuit with the reversed polarity as shown in FIG. 12 may be used.

What is claimed is:

1. A search type tuning device comprising
  a. a voltage-controlled type oscillator stage (11) whose oscillation frequency is controlled in response to a sweep voltage applied thereto;
  b. means for providing an input frequency, a frequency discriminator stage means (9) for subtracting the oscillation frequency of said oscillator (11) and said input frequency and for producing an output voltage corresponding to said difference;
  c. a low-pass filter (13) connected to said frequency discriminator stage means for smoothing the output of said frequency discriminator stage means (9);
  d. a sweep driving voltage source (16) providing a predetermined output voltage;
  e. an adder (17), operationally connected to said sweep driving voltage both during and after the sweeping operation for linearly adding the output from said low-pass filter (13) and the output voltage from said sweep driving voltage source (16) both during and after the sweeping operation; and
  f. an integrator 15 for integrating the output from said adder (17) and for applying the integrated output to said oscillator (11), said integrated output serving as a sweep voltage for controling its oscillation frequency.

2. A search type tuning device as set forth in claim 1 wherein said low-pass filter (13) is passive filter.

3. A search type tuning device as set forth in claim 1 wherein said low-pass filter (13) is an active filter.

4. A search type tuning device as set forth in claim 1 further comprising
  a clamping circuit (14) interconnected between said low-pass filter (13) and said adder (17) for applying the output from said low-pass filter (13) to said adder (17) only when the output from said low-pass filter (13) exceeds a predetermined value.

5. A search type tuning device as set forth in claim 4 wherein said clamping circuit comprises a diode whose one terminal is connected to the output of said low-pass filter and whose the other terminal is connected to a reference voltage source including the ground.

6. A search type tuning device as set forth in claim 4 wherein said clamping circuit comprises a. an operational amplifier whose one input terminal is connected to the output of said low-pass filter and whose the other input terminal is connected to a reference voltage source; and b. a diode interconnected between said one input terminal and the output terminal of said operational amplifier.

7. A search type tuning device as set forth in claim 1 wherein

A. said voltage-controlled type oscillator stage comprises a. a first frequency sweep oscillator (20) capable of oscillating in a constant frequency as well as of sweeping its oscillation frequency in a first predetermined frequency range, b. a second frequency sweep oscillator (23) capable of oscillating in a constant frequency as well as of sweeping its oscillation frequency in a second predetermined frequency range, c. control means for controlling to reverse alternately the operable states of said first and second frequency sweep oscillators (20, 23) in such a manner that whenever one of said first and second oscillators is in a constant frequency oscillation mode, the other oscillator sweeps its oscillation frequency through its predetermined frequency range, and vice versa, whereby an intermittent frequency sweep can be accomplished alternately by said first and second frequency sweep oscillators (20, 23), d. mixer (22) for generating an output frequency equal to the difference frequency between the oscillation frequencies of said first and second frequency sweep oscillators (20, 23);

B. said frequency discriminator stage comprises a frequency discriminator (25, 26; 53) having a low-pass filter for generating an output when the difference frequency between said first and second frequency sweep oscillators (20, 23) reach a first predetermined difference frequency ($\Delta f_1$) and a second predetermined difference frequency ($\Delta f_2$);

C. said sweep driving voltage source, said adder and said integrator comprise a. a first voltage sweep circuit (31) for causing said first frequency sweep oscillator (20) to sweep its oscillation frequency in response to the output control signal from said frequency discriminator (25; 53), b. a second voltage sweep circuit (32) for causing said second frequency sweep oscillator (23) to sweep its oscillation frequency in response to the output control signal from said frequency discriminator (26; 53);

D. said first frequency sweep oscillator (20), said discriminator (25; 53) and said first voltage sweep circuit (31) form a search type tuning circuit;

E. said second frequency sweep oscillator (23), said mixer (22), said frequency discriminator (26; 53) and said second voltage sweep circuit (32) form a second search type tuning circuit; and F. said tuning device further comprises means for alternately reversing the operable states of said first and second frequency sweep oscillators (20, 23) in such a manner that whenever one of said first and second oscillators is in a constant frequency oscillation mode, the other oscillator sweeps its oscillation frequency through its predetermined frequency range, and vice versa, in response to the outputs from said frequency discriminators (25, 26; 53).

8. A search type tuning device as set forth in claim 7 wherein said low-pass filter is an active filter.

9. A search type tuning device as set forth in claim 7 wherein said low-pass filter is passive filter; and the reference frequency of said frequency discriminator stage of said search type tuning circuit is deviated by an amount equal to the frequency error in the steady state of said search type tuning circuit.

10. A search type tuning device as set forth in claim 7 further comprising a. an auxiliary local oscillator (50) for further converting the frequency of the output signal from said mixer (22) into a third intermediate frequency.

b. a mixer (51) for mixing the outputs from an auxiliary intermediate frequency amplifier (24) and said auxiliary local oscillator (50), c. means for determining the oscillation frequency ($f$) of said auxiliary local oscillator (50) and the first and second predetermined difference frequencies ($\Delta f_1$, $\Delta f_2$) in such a relation that the difference frequency ($\Delta f_1 - f$) between said frequency ($f$) and said first predetermined difference frequency ($\Delta f_1$) equals to the difference frequency ($f - \Delta f_2$) between said frequency ($f$) and said second predetermined difference frequency ($\Delta f_2$), d. means for discriminating said difference frequencies ($\Delta f_1 - f$) and ($f - \Delta f_2$) by only one frequency discriminator (53), and e. means for controlling both said first and second frequency sweep oscillators (20, 23) in response to the outputs from said frequency discriminator (53).

11. A search type tuning device as set forth in claim 7 further comprising a counter (37) connected to said control means for counting a number of alternate reversals of the operable state of said first and second frequency sweep oscillators (20, 23), selector means for entering and storing a predetermined number, comparator means for comparing said stored predetermined number with the content of said counter, and for providing a control output in response to an identity between the stored number and said counter content, said first and second frequency sweep oscillators being responsive to said control output for stopping their alternate frequency sweep operations.

12. A search type tuning device as set forth in claim 7 further comprising a. a counter (37) for counting the number of alternate reversals of the operable state of said first and second frequency sweep oscillators (20,23), selector means for entering and storing a predetermined number, comparator means for comparing said stored predetermined number with the content of said counter and for providing a control output in response to an identity between said stored number and said counter content, both of said first and second frequency sweep oscillators (20,23) being responsive to said control output for stopping their alternate frequency sweep operations, b. a programmable counter (45) for dividing said predetermined numbers into a plurality of numerical ranges and for causing said counter (37) to start counting from the lowest number of the numerical ranges to which belongs said predetermined number, and c. a band selector (49) for switching the frequency range of the oscillation frequency of said first and second frequency sweep oscillators (20,23) in response to the numerical range to which belongs said predetermined number.

* * * * *

UNITED STATES PATENT OFFICE
CERTIFICATE OF CORRECTION

Patent No. 4,004,233     Dated January 18, 1977

Inventor(s) Yoichi Sakamoto

It is certified that error appears in the above-identified patent and that said Letters Patent are hereby corrected as shown below:

Column 2, line 46: Change "undsired" to --undesired--.

Column 3, lines 57 and 59: Change "107 $_o(t)$" to --$w_o(t)$--.

Column 3, line 60: "107 $_i$" should be --$w_i$--.

Column 4, line 9: Change "oscillatr" to --oscillator--.

Column 5, line 7, formula #3 should read as follows:

$$--v_c(t) = K_d \int_0^t f(t - u) \left\{ w_i - w_o(u) \right\} du + v_c(0) --.$$

Column 5, line 20: Change "(t, into Eq. (4)" to

--(t) into Eq. (4)--.

Column 6, line 17, in the formula: Change "$t_1$" and "$t_2$" to

--$\tau_1$-- and $\tau_2$-- respectively.

Column 6, line 43: Change "$w_s$" to --$\dot{w}_s$--.

Column 6, line 43: Change "$K_o V_s/t$" to --$K_o V_s/\tau$--.

Column 6, line 50: Change "$\zeta, w_{n1}$" to --$\zeta, w_n$--.

Column 9, line 23: Insert a period after "32".

UNITED STATES PATENT OFFICE
CERTIFICATE OF CORRECTION

Patent No. 4,004,233  Dated January 18, 1977

Inventor(s) Yoichi Sakamoto

It is certified that error appears in the above-identified patent and that said Letters Patent are hereby corrected as shown below:

Column 10, line 10: Change "MTSC" to --NTSC--.

Column 10, line 19: Change "FC" to --BC--.

Column 11, line 51: Change "$f - f_o$ or $f \times f_o$" to --$f - f_o$ or $f + f_o$--.

Column 12, line 57: Change "controling" to --controlling--.

Signed and Sealed this thirtieth Day of August 1977

[SEAL]

Attest:

RUTH C. MASON
Attesting Officer

C. MARSHALL DANN
Commissioner of Patents and Trademarks